(12) United States Patent
Fujii et al.

(10) Patent No.: US 10,962,602 B2
(45) Date of Patent: Mar. 30, 2021

(54) BATTERY MONITORING DEVICE

(71) Applicant: Yazaki Corporation, Tokyo (JP)

(72) Inventors: Hironao Fujii, Susono (JP); Jian Wang, Susono (JP)

(73) Assignee: YAZAKI CORPORATION, Tokyo (JP)

( * ) Notice: Subject to any disclaimer, the term of this patent is extended or adjusted under 35 U.S.C. 154(b) by 48 days.

(21) Appl. No.: 16/508,534

(22) Filed: Jul. 11, 2019

(65) Prior Publication Data

US 2020/0057114 A1 Feb. 20, 2020

(30) Foreign Application Priority Data

Aug. 14, 2018 (JP) .............................. JP2018-152624

(51) Int. Cl.
*G01R 31/396* (2019.01)
*G01R 31/382* (2019.01)
(Continued)

(52) U.S. Cl.
CPC ......... *G01R 31/396* (2019.01); *G01R 31/382* (2019.01); *H01M 10/4207* (2013.01); *H01M 10/482* (2013.01); *H01M 2010/4271* (2013.01); *H01M 2010/4278* (2013.01); *Y02E 60/10* (2013.01)

(58) Field of Classification Search
CPC .. G01R 31/396; G01R 31/382; G01R 31/371; H04Q 2209/75; H04Q 2209/80; H04Q 2209/86; H04Q 2209/40; H04Q 9/00; H04Q 2209/43; G08C 17/02; H01M 10/482; H01M 10/425; H01M 2010/4271; H01M 2010/4278; H01M 10/48; H01M 10/4257; H02J 7/0021; H02J 7/0047; H02J 7/0048; Y02E 60/10
See application file for complete search history.

(56) References Cited

U.S. PATENT DOCUMENTS 10,193,190 B2 1/2019 Yamazoe et al.
2012/0214415 A1\* 8/2012 Harvey ................ H05K 7/1425
455/41.2
(Continued)

FOREIGN PATENT DOCUMENTS

JP 2003-46540 A 2/2003
JP 2016-157681 A 9/2016
(Continued)

OTHER PUBLICATIONS

Y. Wu, X. Liao, W. Chen and D. Chen, "A Battery Management System for electric vehicle based on Zigbee and CAN," 2011 4th International Congress on Image and Signal Processing, Shanghai, 2011, pp. 2517-2521 (Year: 2011).\*
(Continued)

*Primary Examiner* — Daniel R Miller
(74) *Attorney, Agent, or Firm* — Sughrue Mion, PLLC

(57) ABSTRACT

A battery monitoring device is provided which improves communication quality, communication stability, and communication reliability. An ECU substrate and detection substrates which cannot directly communicate with the ECU substrate communicate via a relay substrate which is a detection substrate set up as relay of the detection substrates.

9 Claims, 5 Drawing Sheets

(51) Int. Cl.
*H01M 10/42* (2006.01)
*H01M 10/48* (2006.01)

(56) References Cited

U.S. PATENT DOCUMENTS

| | | | |
|---|---|---|---|
| 2016/0056510 A1 | 2/2016 | Takeuchi et al. | |
| 2016/0247389 A1 | 8/2016 | Shimizu et al. | |
| 2016/0268642 A1* | 9/2016 | Yamazoe | H01M 10/482 |
| 2019/0128970 A1* | 5/2019 | Taya | G01R 31/371 |
| 2020/0106278 A1* | 4/2020 | Sung | H02J 7/00032 |

FOREIGN PATENT DOCUMENTS

| | | |
|---|---|---|
| JP | 2018-061303 A | 4/2018 |
| WO | 2015/063945 A1 | 5/2015 |
| WO | 2015/189898 A1 | 12/2015 |

OTHER PUBLICATIONS

M. Schneider et al., "Automotive battery monitoring by wireless cell sensors," 2012 IEEE International Instrumentation and Measurement Technology Conference Proceedings, Graz, 2012, pp. 816-820 (Year: 2012).*

S. A. Mathew, R. Prakash and P. C. John, "A smart wireless battery monitoring system for Electric Vehicles," 2012 12th International Conference on Intelligent Systems Design and Applications (ISDA), Kochi, 2012, pp. 189-193 (Year: 2012).*

T. Faika, T. Kim and M. Khan, "An Internet of Things (IoT)-Based Network for Dispersed and Decentralized Wireless Battery Management Systems," 2018 IEEE Transportation Electrification Conference and Expo (ITEC), Long Beach, CA, Jun. 2018, pp. 1060-1064 (Year: 2018).*

* cited by examiner

BATTERY MONITORING DEVICE

BACKGROUND OF THE INVENTION

Field of the Invention

The present invention relates to a battery monitoring device.

Description of the Related Art

As a battery monitoring device that monitors a state of a battery pack having a plurality of battery modules, for example, those shown in Patent Literatures 1 and 2 have been proposed. The battery monitoring device shown in Patent Literatures 1 and 2 includes a plurality of detectors (detection unit) for detecting state data of each battery module, and an ECU (monitor) for acquiring the state data from the plurality of detectors.

In Patent Literatures 1 and 2, each detector and the ECU communicate via wireless communication, and the ECU therefore detects the state data detected by the plurality of detectors.

However, in Patent Literatures 1 and 2 described above, the communication path between each detector and the ECU is a single one. For this reason, when a failure or the like occurs in a single communication path, communication is interrupted. In addition, the system is susceptible to noise, which raises concerns about noise immunity. That is, there has been posed problems of communication quality, communication stability and communication reliability.

PATENT LITERATURE

Patent Literature 1: Japanese Patent Application Publication No. 2016-157681
Patent Literature 2: Japanese Patent Application Publication No. 2018-61303

SUMMARY OF THE INVENTION

The present invention is made in view of the above background, and aims at providing a battery monitoring device intended to improve communication quality, communication stability, and communication reliability.

A battery monitoring device according to an aspect of the present invention includes: a plurality of detectors provided corresponding to each of a plurality of battery modules constituting a battery pack, each including a detection circuit for detecting state data of the corresponding battery module, and a first wireless circuit for wirelessly transmitting the detected state data; and a monitor including a second wireless circuit configured to receive the state data transmitted from the plurality of detectors, wherein the first wireless circuit receives the state data wirelessly transmitted from another detector, and transmits wirelessly the state data of the another detector to the second wireless circuit.

Preferably, the monitor and the detector unable to directly communicate with the monitor communicate with each other via a relay detector which is the detector set up as a relay of the detector.

Preferably, the monitor wirelessly transmits a transmission command of the state data to one detector of the plurality of detectors, and when unable to directly communicate with the one detector as a result of transmitting, transmits the transmission command of the state data of the one detector to the relay detector which is the detector set up as the relay of the detector.

Preferably, the monitor includes a plurality of the second wireless circuits.

Preferably, the monitor, when unable to communicate with the detector using one second wireless unit of the plurality of second wireless circuits, switches the second wireless circuit to communicate with the detector.

According to the aspect described above, communication quality, communication stability, and communication reliability can be improved.

DETAILED DESCRIPTION OF THE PREFFERED EMBODIMENTS

First Embodiment

Figure 1:
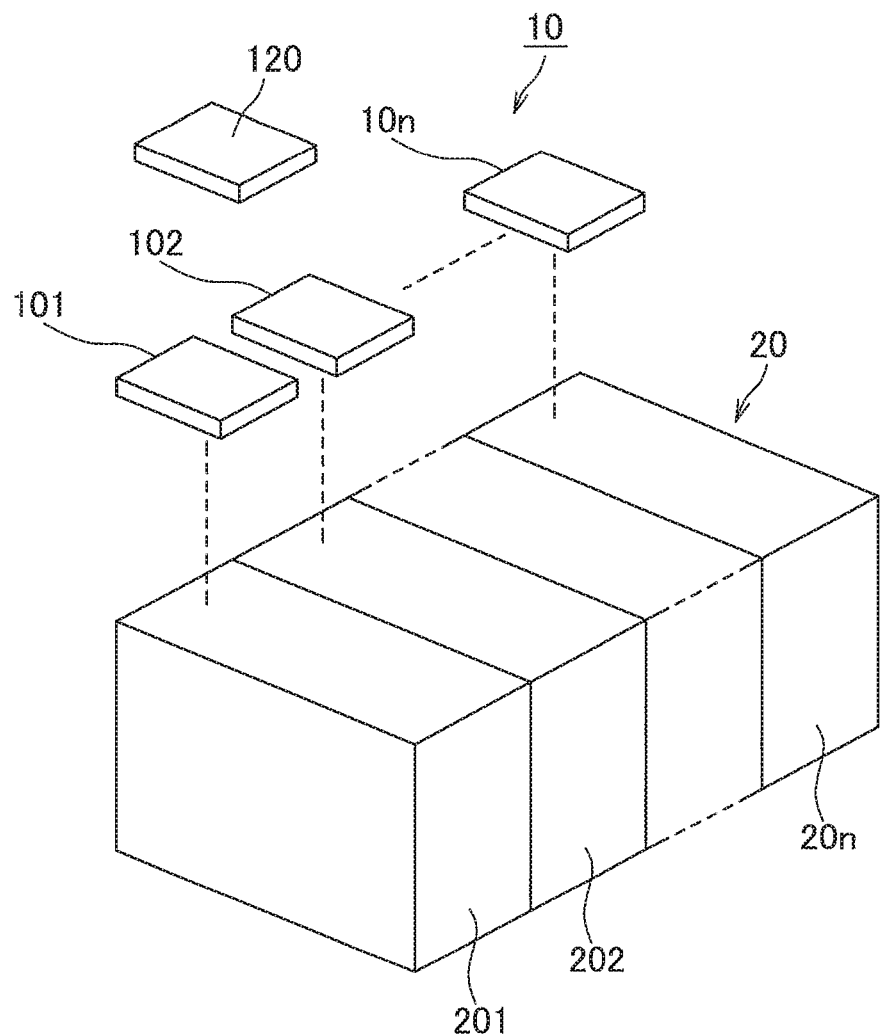
FIG. 1 is a perspective view showing an embodiment of a battery monitoring device of the present invention.
Figure 2:
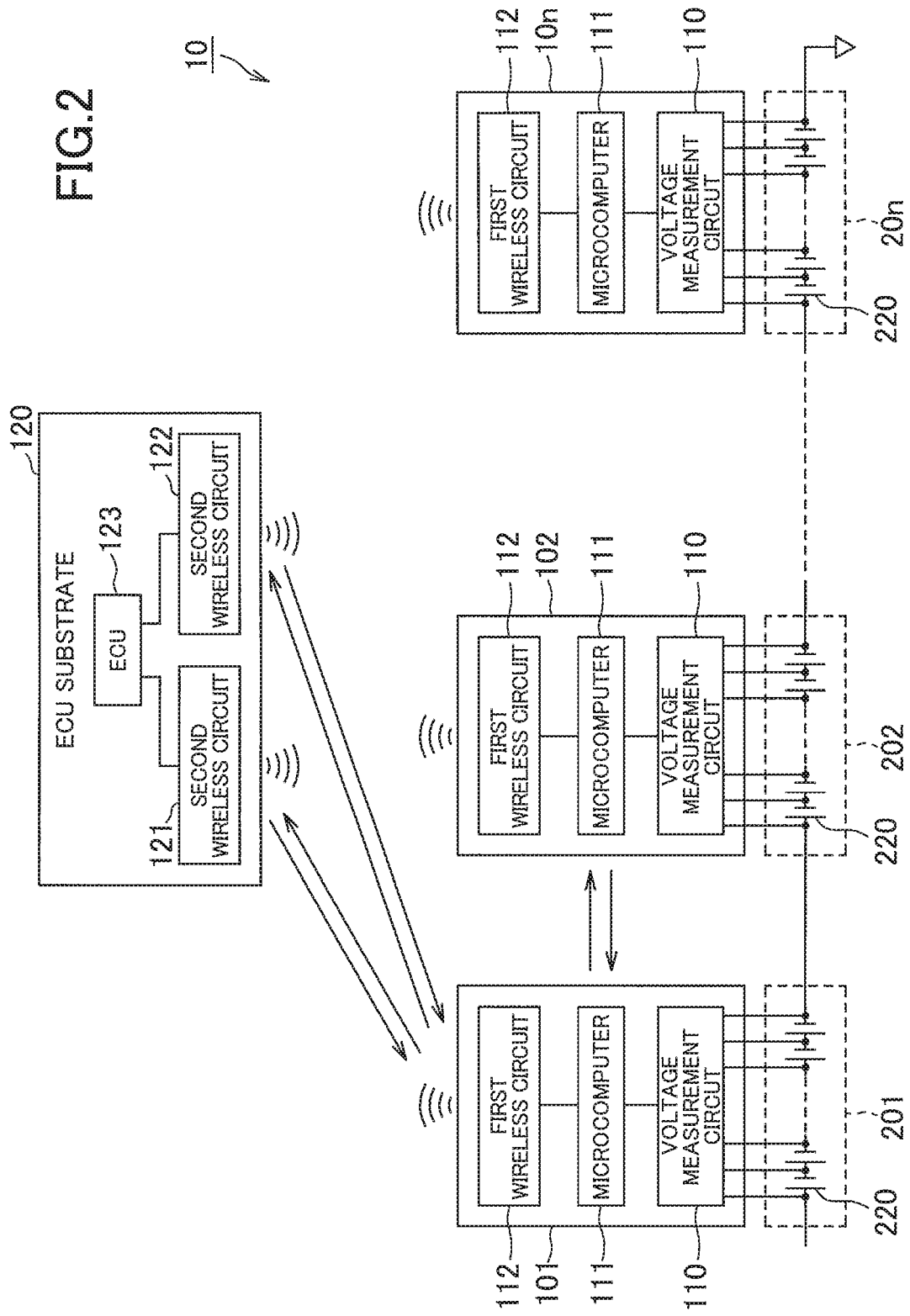
FIG. 2 is an electrical configuration diagram of the battery monitoring device shown in FIG. 1.

One embodiment of a battery monitoring device 10 of the present invention will be described with reference to FIGS. 1 and 2. FIG. 1 is a perspective view showing an embodiment of a battery monitoring device 10 of the present invention. FIG. 2 is an electric block diagram of the battery monitoring device 10. The battery monitoring device 10 is a device that monitors a state of the battery pack 20 mounted on a vehicle (not shown). Such vehicles are those such as a hybrid car or an electric car that travels by driving force from an electric motor. The battery pack 20 supplies power to the electric motor mounted on this vehicle.

The battery pack 20 is constituted by a plurality of battery modules 20₁ to 20n connected in series. The plurality of battery modules 20₁ to 20n is constituted by a plurality of batteries 220 connected in series (see FIG. 2). In the present embodiment, although an example in which battery modules 20₁ to 20n are composed of a plurality of batteries 220 will be described, the battery modules 20₁ to 20n may be composed of one battery 220.

The battery monitoring device 10 is a device that monitors a state of the battery modules 20₁ to 20n constituting the battery pack 20, and includes detection output substrates 10₁ to 10n (detector) corresponding to each of the plurality of battery modules 20₁ to 20n and one ECU substrate 120 (monitor).

The plurality of detection substrates 10₁ to 10n is provided in one-to-one correspondence with the battery modules 20₁ to 20n, and one of the detection substrates 10₁ to 10n is mounted with respect to one of the battery modules 20₁ to 20n. Each of the plurality of detection substrates 10₁ to 10n has, as shown in FIG. 2, a voltage measurement circuit (detection circuit) 110, a micro computer (hereinafter, microcomputer) 111, and a wireless circuit 112.

The voltage measurement circuit 110 measures a voltage of the battery constituting the battery modules 201 to 20$n$. The first wireless circuit 112 has a modulation/demodulation circuit, an antenna (not shown), etc., which wirelessly communicates with the ECU substrate 120 and other detection substrates 101 to 10$n$ described later. The microcomputer 111 has a CPU, a ROM, and a RAM that are known, and controls a voltage measurement circuit 110 or the first wireless circuit 112.

One ECU substrate 120 is provided with respect to the plurality of detection substrates 101 to 10$n$. The ECU substrate 120 includes second wireless circuits 121 and 122 and an ECU 123.

In the present embodiment, two second wireless circuits 121 and 122 are provided. The second wireless circuits 121 and 122 each have a modulation/demodulation circuit, an antenna (not shown), etc., which wirelessly communicate with the detection substrates 101 to 10$n$. The ECU 123 has a CPU, a ROM, and a RAM that are known, controls the second wireless circuit 121, 122, and monitors the battery packs 201 to 20$n$ based on the voltage measured by the detection substrate 101 to 10$n$ (abnormal detection processing, equalization processing, and the like).

Next, an operation of the battery monitoring device 10 having the above-described configuration will be briefly described. First, the ECU 123 sequentially transmits a command signal (transmission command) of the measurement values (state data) of the voltage for each of the detection substrates 101 to 10$n$. For example, a case of transmitting a transmission command to the detection substrate 101 which is one of the plurality of detection substrates 101 to 10$n$ will be described. The ECU 123 first transmits the command signal to the detection substrate 101 using the second wireless circuit 121.

If the second wireless circuit 121 of the ECU 123 and the detection substrate 101 cannot directly communicate with each other, the ECU 123 then transmits the command signal to the detection substrate 101 using the second wireless circuit 122. If the second wireless circuit 122 of the ECU 123 and the detection substrate 101 cannot directly communicate with each other, the ECU 123 then transmits the command signal through a relay substrate which is one of the other detection substrates 102 to 10$n$.

Figure 3:
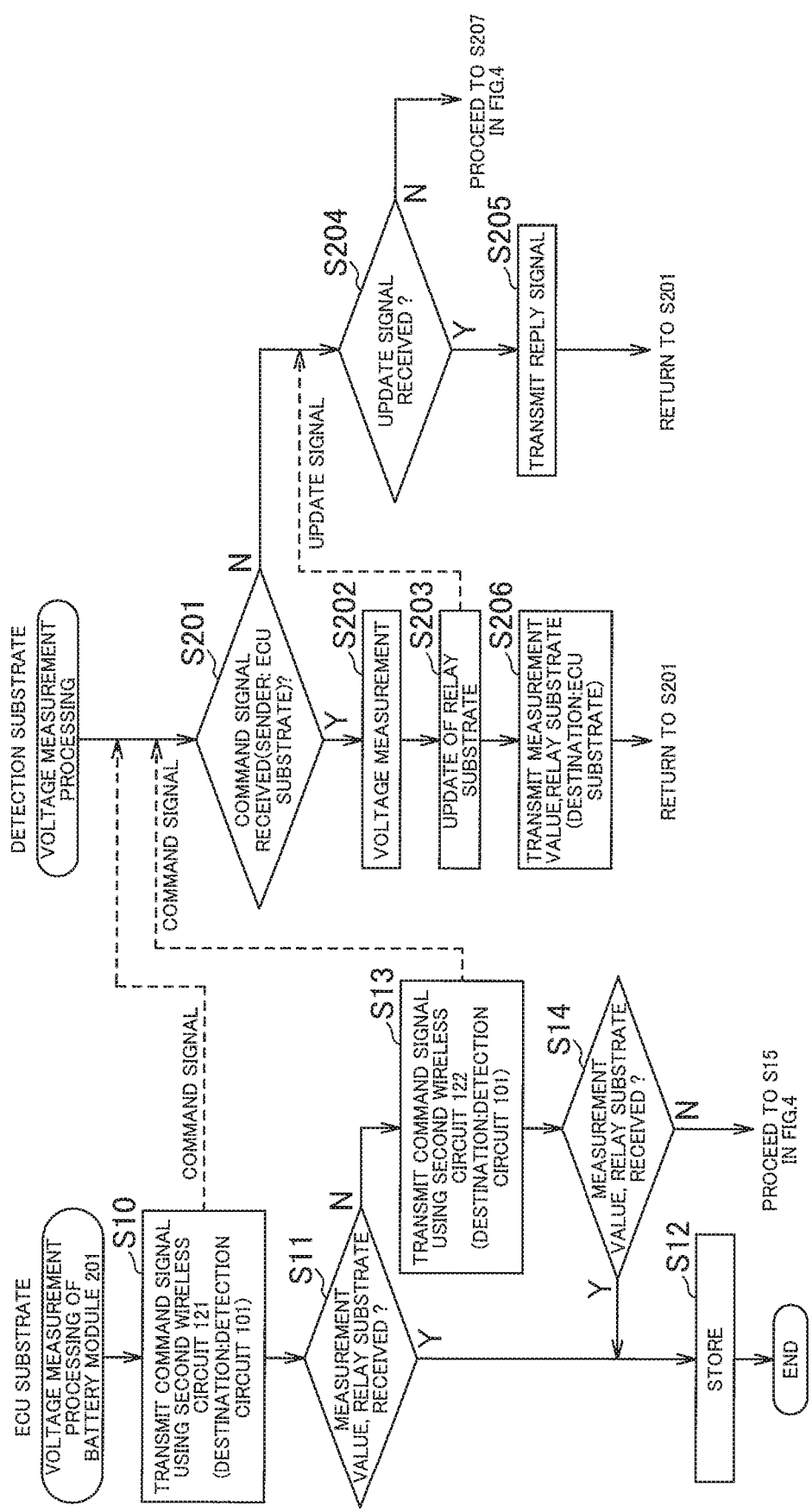
FIG. 3 is a flowchart showing a processing procedure of an ECU of an ECU substrate and a microcomputer of a detection substrate shown in FIG. 2 in a first embodiment.
Figure 4:
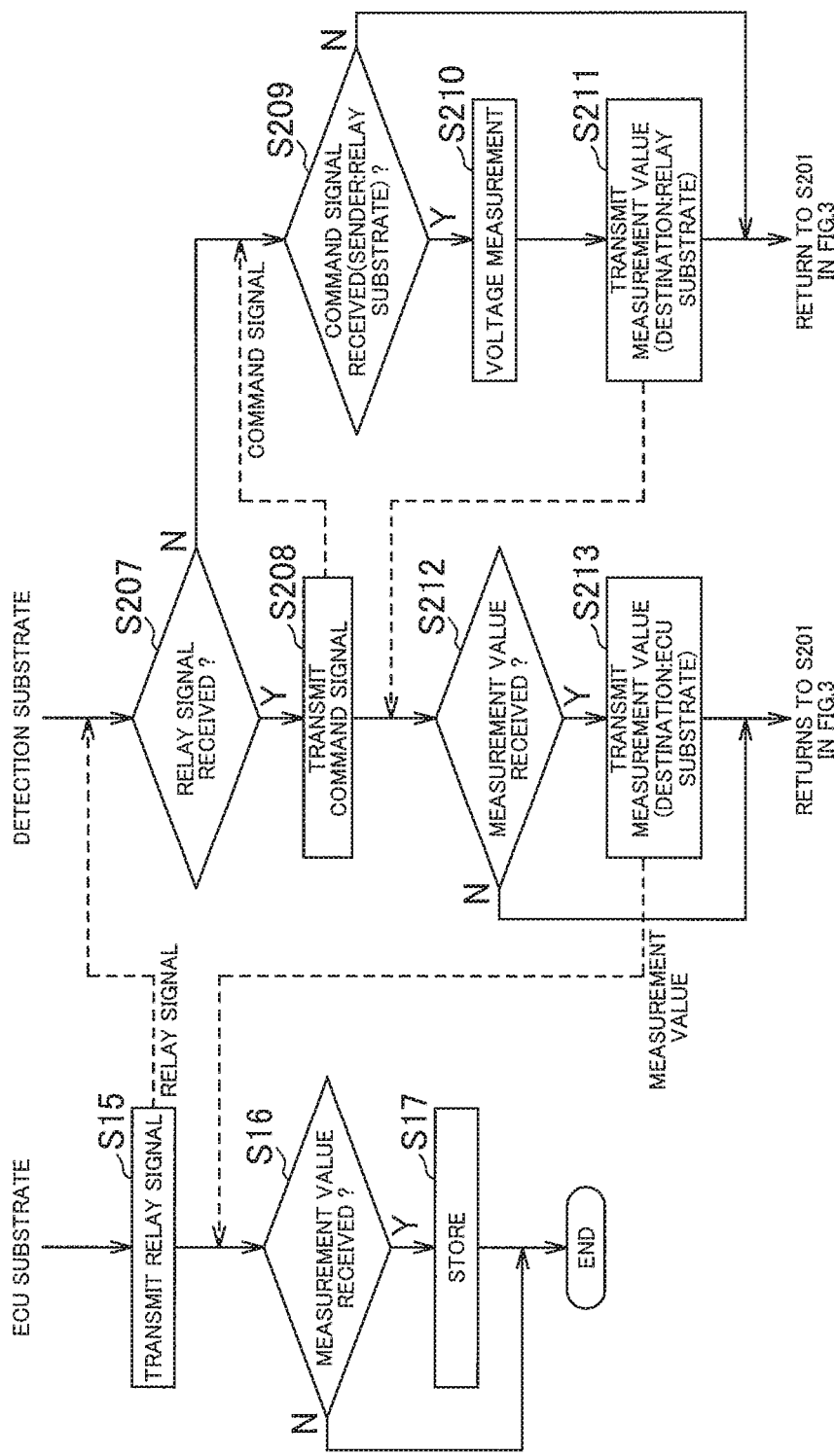
FIG. 4 is a flowchart showing a processing procedure of the ECU of the ECU substrate and the microcomputer of the detection substrate shown in FIG. 2 in the first embodiment.

Next, the monitoring process of the battery monitoring device described in the above outline will be described below with reference to FIG. 3 and FIG. 4. First of all, the ECU 123 sequentially performs the voltage measurement process for the battery modules 201 to 20$n$. First, the voltage measurement process of the battery module 201 will be described.

In the voltage measurement process of the battery module 201, the ECU 123 transmits the command signal instructing transmission of the measured value to the detection substrate 101 using the second wireless circuit 121 (step S10). If the second wireless circuit 121 and the detection substrate 101 can communicate with each other, the detection substrate 101 receives the command signal from the ECU substrate 120.

The microcomputer 111 of the detection substrate 101, when receiving the command signal which indicates the ECU substrate 120 as a sender and itself as a destination (Y in step S201), controls the voltage measurement circuit 110 to measure the voltage of the battery 220 of the corresponding battery module 201 (step S202). Furthermore, the detection substrate 101 updates the relay substrate (step S203). At step S203 the detection substrate 101 sequentially transmits the update signal to the other detection substrates 102 to 10$n$.

Of the other detection substrates 102 to 10$n$ one that can communicate with the detection substrate 101 receives the above-described update signal. Then, the microcomputer 111 of the other detection substrates 102 to 10$n$, when receiving the update signal (Y in step S204), returns to step S201 after transmitting a reply signal to the detection substrate 101 that is the sender (step S205). The detection substrate 101, when receiving the reply signal from the other detection substrates 102 to 10$n$, updates as the relay substrate the detection substrate 102 to 10$n$ with the highest RSSI (received signal strength) among the received reply signals (step S203). The detection substrate 101 may update as the relay substrate the detection substrate 102 to 10$n$ with the smallest communication delay from transmission of the update signal to reception of the reply signal.

After that, the detection substrate 101 transmits the measurement value measured in step S202 and the relay substrate updated in step S203 to the ECU substrate 120 (step S206), and then returns to step S201. The ECU 123, when receiving the measured value and the relay substrate from the detection substrate 101 (Y in step S11), updates and stores the measured value and the relay substrate stored in the RAM (not shown) (step S12), and ends the process.

On the other hand, if the second wireless circuit 121 and the detection substrate 101 cannot communicate with each other, there is no reply to the command signal from the detection substrate 101. Therefore, for example, the ECU 123, if not possible to receive the measurement value from the detection substrate 101 even after a predetermined time elapses (N in step S11), determines that the second wireless circuit 121 and the detection substrate 101 cannot communicate with each other. Next, ECU 123 transmits the command signal to the detection substrate 101 using the second wireless circuit 122 (step S13).

The microcomputer 111 of the detection substrate 101 receives a command signal whose sender is the ECU substrate 120 (Y in step S201), and similarly then proceeds to steps S202 to S204. It follows from this that the measurement value measured in the step S202 and the relay substrate updated in step S203 are similarly transmitted to the ECU substrate 120 from the detection substrate 101. The ECU 123, when receiving the measured value and the relay substrate from the detection substrate 101 via the second wireless circuit 122 (step S14), proceeds to step S12, updates and stores the measured value and the relay substrate stored in the RAM (not shown), and ends the process.

If the second wireless circuit 122 and the detection substrate 101 cannot communicate with each other, there is no reply to the command signal from the detection substrate 101. Therefore, the ECU 123, if not possible to receive the measurement value from the detection substrate 101 even after a predetermined time elapses or transmission is retried more than the predetermined number (N in step S14), determines that the second wireless circuit 122 and the detection substrate 101 cannot communicate with each other, proceeds to step S15 in FIG. 4.

In step S15, the ECU 123 transmits to the relay substrate corresponding to the detection substrate 101 stored in the RAM a relay signal instructing relay of the command signal (addressed to the detection substrate 101). If the ECU substrate 120 and the relay substrate can communicate with each other, the microcomputer 111 of the detection substrate 102 to 10$n$ to be the relay substrate receives the relay signal (step S207 in FIG. 4). The microcomputer 111 of the detection substrate 102 to 10$n$ to be the relay substrate, when receiving the relay signal of the ECU substrate 120 whose destination is itself and sender is the ECU substrate 120 (Y in step 207), transmits the command signal of the measurement value to the detection substrate 101 (step S208).

If the relay substrate and the detection substrate 101 can communicate with each other, the detection substrate 101 receives the command signal whose sender is the relay substrate. The detection substrate 101, when receiving the command signal whose sender is the relay substrate (Y in step S209), controls the voltage measurement circuit 110 to measure the battery voltage of the corresponding battery module 201 (step S210). Thereafter, the detection substrate 101 transmits the measured value to the relay substrate that is the sender (step S211).

The microcomputer 111 of the detection substrate 102 to 10n to be relay substrate, when receiving the measured value from the detection substrate 101 (Y in step S212), transmits the received measured value to ECU substrate 120 (step S213). The ECU 123, when receiving the measured value from the relay substrate (step S16), updates and stores the measurement value stored in the RAM (not shown) (step S17). The ECU 123, if not possible to receive the measurement value after transmitting the relay signal (N in step 16), ends the processing immediately.

Thereafter, the ECU 123 executes voltage measurement process of the battery modules 202 to 20n. The voltage measurement process of the battery modules 202 to 20n, where the ECU 123 only each sets the destination of the command signal to the detection substrates 102 to 10n, is similar to the voltage measurement of the above-described battery module 201, of which detailed description is thus omitted here.

According to the above-described embodiment, the first wireless circuit 112 of the relay substrate receives the measurement value wirelessly transmitted from the other detection substrate 101 to 10n, and transmits the measured value received from the other detection substrates 101 to 10n to the ECU substrate 120. Thus, even if any of the ECU substrate 120 and any of the detection substrates 101 to 10n cannot communicate directly, communication can be performed via the relay substrate, thereby improving communication quality, communication stability, and communication reliability.

Further, according to the above-described embodiment, the ECU substrate 120 wirelessly transmits the transmission command of the measurement value to one of the plurality of detection substrates 101 to 10n, and the detection circuit 101 for example, when not possible to directly communicate with the detection substrate 101 as a result of transmitting, transmits the transmission command of the state data of the detection substrate 101 to the relay substrate to be relay to the detection substrate 101. Thus the ECU substrate 120 and the detection substrates 101 to 10n can, if possible, communicate directly. Also the ECU substrate 120 and the detection substrates 101 to 10n can, if not possible to directly communicate, communicate via the relay substrate.

Further, according to the above-described embodiment, the ECU substrate 120 includes the plurality of second wireless circuits 121, and 122. Thereby, the detection substrates 101 to 10n, if cannot communicate using one of the plurality of second wireless circuits 121 and 122, can communicate using the other.

Second Embodiment

Next, the battery monitoring device 10 of the second embodiment will be described. The major difference is that in the second embodiment the detection substrates 101 to 10n may determine whether to directly communicate with the ECU substrate 120 and instruct the relay though in the first embodiment the ECU 123 instructs the relay in the first embodiment. An example of determining whether direct communication can be performed can be judged by whether or not the reception completion notification (ACK) can be received from the ECU substrate 120 when the measurement values are transmitted from the detection substrates 101 to 10n.

Figure 5:
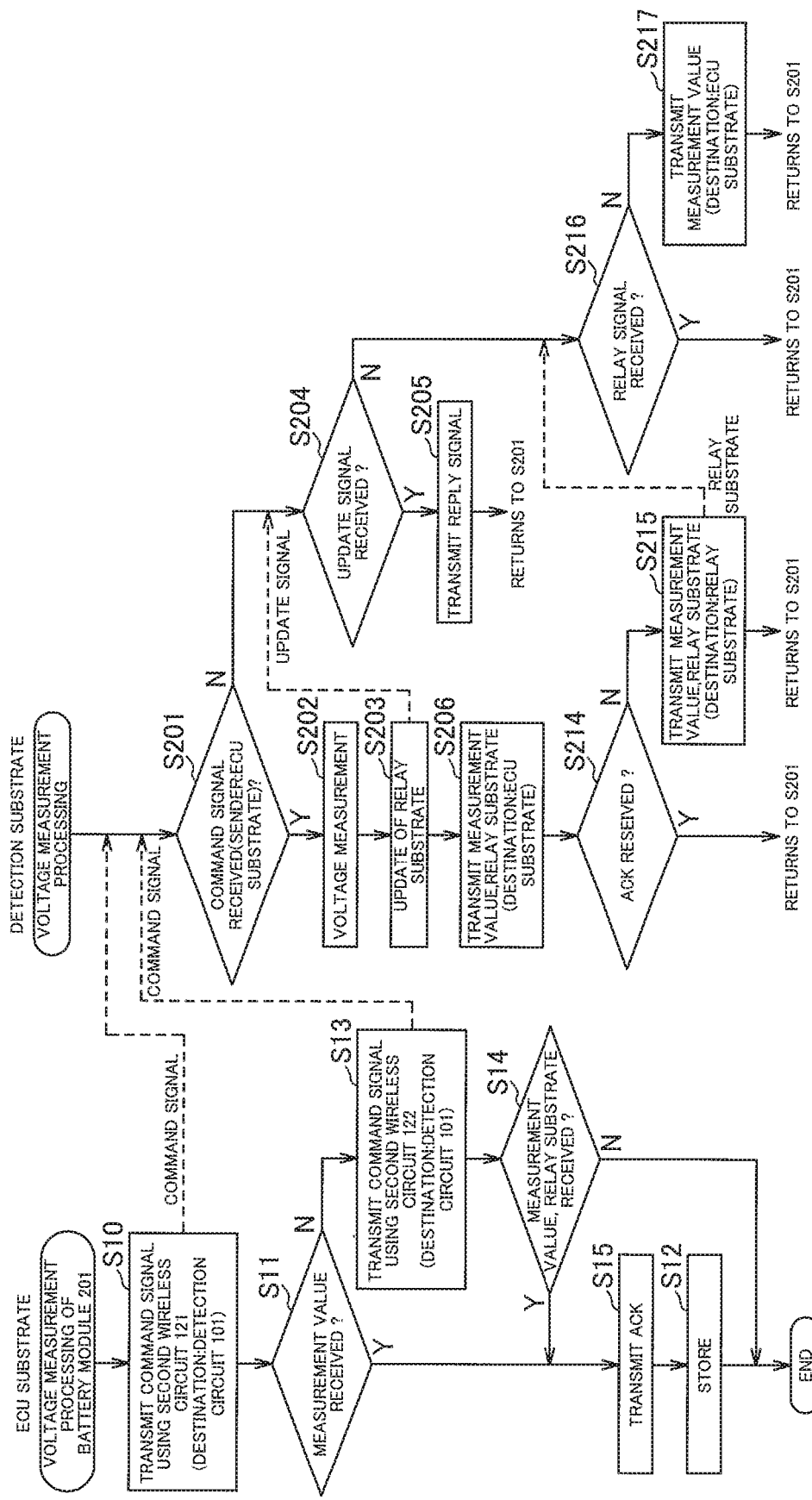
FIG. 5 is a flowchart showing a processing procedure of the ECU of the ECU substrate and the microcomputer of the detection substrate shown in FIG. 2 in a second embodiment.

The monitoring process of the battery monitoring device 10 in the second embodiment described in the outline above will be described below with reference to the flowchart in FIG. 5. Note that in FIG. 5 the same parts as those in the flowcharts of FIGS. 3 and 4 already described in the first embodiment are denoted by the same reference numerals and the detailed description thereof will be omitted.

First, the ECU 123 sequentially executes voltage measurement process of the battery modules 201 to 20n. First, the voltage measurement process of the battery module 201 will be described. In the voltage measurement process of 201, the ECU 123 performs steps S10 to S14 as in the first embodiment. In the second embodiment, the ECU 123, if not receives the measured value in step S14 (N in step S14), immediately ends the process without transmitting the relay signal. Also the ECU 123, receiving the measured value (Y in step S11 or Y in step S14), transmits reception completion notification (ACK) (step S15).

The microcomputer 111 of the detection substrate 101 after performing steps S201 to S203, and S206 similarly to the first embodiment, determines whether the ACK has been received (step S214). If the ACK is received (Y in step S214), the microcomputer 111 proceeds to step S201.

The microcomputer 111, if not receiving the ACK even if a predetermined time or more elapses, or transmissions is retried a predetermined number of times or more (N in step S214), returns to step S201 after transmitting the measured value measured in step S202 and the relay command to the relay substrate updated in step S203 (step S215).

The microcomputer 111, when receiving the relay command (step S216), returns to S201 after transmitting to ECU substrate 120 the measurement value transmitted in accordance with the relay command (step S217).

Note that, according to the above-described embodiment, the priority of communication is in this order the direct communication using the second wireless circuit 121, the direct communication using the second wireless circuit 122, and the relay communication. However, the priority of communication is not limited to this, and relay communication and direct communication may be performed in this order.

Further, according to the above-described embodiment, although the ECU substrate 120 includes the two second wireless circuits 121, 122, it is not limited to this. The number of circuits of the second wireless ECU substrate 120 includes may be one or three or more.

Further, according to the above-described embodiment, the relay substrate is determined based on its RSSI and communication delay after the detection substrates 101 to 10n communicate with each other, but it is not limited to this. The relay substrate may in advance be determined to be adjacent detection substrates 101 to 10n for example.

Further, according to the above-described embodiment, the detection substrates 101 to 10n update the relay substrate upon receiving the command signal, but this is not limited to this. The detection substrates 101 to 10n may update the relay substrate at a timing different from the command signal being received.

Further, according to the above-described embodiment, although the transmission command of the transmission substrate 101 has been described which is one of the plurality of detection substrates 101 to 10n, the same is applied for the case of the detection substrates 102 to 10n.

Further, according to the above-described embodiment, although an example of updating the detection substrate 102 to 10n having the highest RSSI as the relay substrate has been shown, the second wireless circuit 121, 122 having the higher RSSI may be selected and used preferentially.

Further, according to the above-described embodiment, although the ECU substrate 120 or the detection substrate 101 to 10n to which transmission command of the measurement value is issued instructs the relay, the invention is not limited to this. The relay substrate may instruct the relay. When the detection substrates 101 to 10n and the ECU substrate 120 cannot directly communicate with each other, the ACK that should be returned from the ECU substrate 120 cannot be received even if the data is transmitted from the detection substrates 101 to 10n. The relay substrate may detect that the detection substrates 101 to 10n cannot receive the ACK from the ECU substrate 120, instruct data transmission command to the detection substrates 101 to 10n, allow for transmission of the data, and transmit the data from the substrate to the ECU substrate 120.

Further, according to the above-described embodiment, although the detection substrates 101 to 10n having transmitted the transmission command from the ECU substrate 120 transmit the measured value, it is not limited to this. The measurement value may be transmitted from the detection substrate 101 to 10n to the ECU substrate 120 at predetermined time intervals.

Further, the present invention is not limited to the above embodiment. That is, various modifications can be made within the scope not deviating from the gist of the present invention.

REFERENCE SINGS LIST

10 Battery monitoring device
20 Battery pack
101 to 10n Detection substrate (detector)
110 Voltage measurement circuit (detection circuit)
112 First wireless circuit
120 ECU Substrate (monitor)
121, 122 Second wireless circuit
201 to 20n Battery module

What is claimed is:

1. A battery monitoring device, comprising:
a plurality of detectors provided corresponding to each of a plurality of battery modules constituting a battery pack, each including a detection circuit for detecting state data of the corresponding battery module, and a first wireless circuit of a first detector among the plurality of detectors for wirelessly transmitting the detected state data; and
a monitor including a second wireless circuit configured to receive the state data transmitted from the plurality of detectors, wherein
the first wireless circuit receives the state data wirelessly transmitted from another detector of the plurality of detectors, and transmits wirelessly the received state data of the another detector to the second wireless circuit, and wherein
the first detector transmits an update signal to the another detector and receives a return signal from the another detector, updates the another detector as a relay detector, of which the return signal is at least one of a strongest received signal and a lowest communication delay, and transmits information associated with the another detector to the monitor via the first detector, and
the monitor receives and stores the information associated with the another detector updated as the relay detector.

2. The battery monitoring device according to claim 1, wherein
the monitor and the another detector unable to directly communicate with the monitor communicate via the first detector set up as a relay detector.

3. The battery monitoring device according to claim 2, wherein
the monitor wirelessly transmits a transmission command of the state data to the another detector of the plurality of detectors, and when unable to directly communicate with the another detector as a result of transmitting, transmits the transmission command of the state data of the another detector to the detector first set up as the relay detector.

4. The battery monitoring device according to claim 1, wherein
the monitor includes a plurality of the second wireless circuits.

5. The battery monitoring device according to claim 2, wherein
the monitor includes a plurality of the second wireless circuits.

6. The battery monitoring device according to claim 3, wherein
the monitor includes a plurality of the second wireless circuits.

7. The battery monitoring device according to claim 4, wherein
the monitor, when unable to communicate with the first detector using another second wireless unit, switches the second wireless circuit to communicate with the first detector.

8. The battery monitoring device according to claim 5, wherein
the monitor, when unable to communicate with the first detector using another second wireless unit, switches the second wireless circuit to communicate with the first detector.

9. The battery monitoring device according to claim 6, wherein
the monitor, when unable to communicate with the first detector using another second wireless unit of the plurality, switches the second wireless circuit to communicate with the first detector.

* * * * *